(12) United States Patent
Zhou (10) Patent No.: US 10,651,092 B2
(45) Date of Patent: May 12, 2020

(54) SEMICONDUCTOR DEVICE AND FABRICATION METHOD THEREOF

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

(*) Notice: Subject to any disclaimer, the term of this patent is extended or adjusted under 35 U.S.C. 154(b) by 0 days.

(21) Appl. No.: 16/234,340

(22) Filed: Dec. 27, 2018

(65) Prior Publication Data

US 2019/0206742 A1    Jul. 4, 2019

(30) Foreign Application Priority Data

Dec. 29, 2017   (CN) .......................... 2017 1 1478120

(51) Int. Cl.
*H01L 21/82* (2006.01)
*H01L 21/76* (2006.01)
(Continued)

(52) U.S. Cl.
CPC ................ *H01L 21/823481* (2013.01); *H01L 21/31116* (2013.01); *H01L 21/76224* (2013.01);
(Continued)

(58) Field of Classification Search
CPC ....... H01L 21/823481; H01L 21/31116; H01L 21/76224; H01L 21/823431; H01L 27/0886; H01L 21/30625
(Continued)

(56) References Cited

U.S. PATENT DOCUMENTS

| 2015/0014790 A1* | 1/2015 | Peng | H01L 21/76224 257/401 |
| 2016/0093614 A1* | 3/2016 | Cheng | H01L 27/0886 257/401 |

(Continued)

*Primary Examiner* — Sheikh Maruf
(74) *Attorney, Agent, or Firm* — Anova Law Group, PLLC (57) ABSTRACT

Semiconductor device and fabrication method are provided. The method includes: providing a base substrate; forming an isolation structure film on the base substrate, a top portion of the isolation structure film containing a plurality of first openings; forming a second opening at a bottom of each first opening by removing a portion of the isolation structure film to expose a surface of the base substrate, where the second opening has a size larger than a corresponding first opening along a direction in parallel with the surface of the base substrate; forming fins in the first and second openings; and forming an isolation structure by removing a portion of an isolation material film, where a top surface of the isolation structure is lower than a top surface of the fins and the isolation structure covers a portion of the sidewalls of the fins. The semiconductor devices formed by the method may reduce the self-heating effect and improve the performance of semiconductor devices.

12 Claims, 4 Drawing Sheets

(51) Int. Cl.
*H01L 21/30* (2006.01)
*H01L 21/8234* (2006.01)
*H01L 27/088* (2006.01)
*H01L 21/762* (2006.01)
*H01L 21/311* (2006.01)
*H01L 21/306* (2006.01)

(52) U.S. Cl.
CPC .. *H01L 21/823431* (2013.01); *H01L 27/0886* (2013.01); *H01L 21/30625* (2013.01)

(58) Field of Classification Search
USPC ................................ 438/284, 286; 257/401
See application file for complete search history.

(56) References Cited

U.S. PATENT DOCUMENTS

| | | | |
|---|---|---|---|
| 2016/0111336 A1* | 4/2016 | Chang | H01L 21/823481 257/401 |
| 2016/0148935 A1* | 5/2016 | Chen | H01L 21/823878 257/369 |
| 2016/0181404 A1* | 6/2016 | Wen | H01L 29/66818 257/401 |
| 2016/0190130 A1* | 6/2016 | Yu | H01L 21/823481 257/401 |
| 2016/0190306 A1* | 6/2016 | Xie | H01L 27/0886 257/401 |
| 2016/0204106 A1* | 7/2016 | You | H01L 27/0886 257/401 |
| 2016/0379976 A1* | 12/2016 | Kim | H01L 29/66545 257/401 |
| 2016/0380051 A1* | 12/2016 | Basker | H01L 29/0649 257/401 |
| 2017/0236933 A1* | 8/2017 | Basker | H01L 29/0657 257/401 |
| 2018/0006111 A1* | 1/2018 | Xie | H01L 29/66795 |
| 2019/0067276 A1* | 2/2019 | Tsai | H01L 21/76897 |

* cited by examiner

SEMICONDUCTOR DEVICE AND FABRICATION METHOD THEREOF

CROSS-REFERENCES TO RELATED APPLICATION

This application claims the priority of Chinese Patent Application No. 201711478120.2, filed on Dec. 29, 2017, the content of which is incorporated herein by reference in its entirety.

TECHNICAL FIELD

The present disclosure generally relates to the field of semiconductor technologies and more particularly, relates to a semiconductor device and its fabrication method.

BACKGROUND

With continuous development in semiconductor technologies, the performance improvement of integrated circuits is mainly achieved by continuously reducing dimensions of the integrated circuit devices to increase their speeds. Currently, due to high device density, high performance, low cost in semiconductor processes and advancements to process nodes of nanotechnologies, the fabrication of semiconductor devices is limited by various physical limits.

With continuous reduction of dimensions of complementary metal-oxide-semiconductor (CMOS) devices, challenges from their manufacturing and design promote the developments of three-dimensional designs such as fin field effect transistors (FinFETs). Compared with conventional planar transistors, the fin field effect transistors have superior performance in channel control and reduction of the shallow channel effect. Planar gate structures are set above the channels, while gate structures of the fin field effect transistors surround the fins. In such way, the static electricity can be controlled from three directions in the fin field effect transistors, which have superior performance in terms of electrostatic control.

However, the fin field effect transistors have a serious self-heating effect. The disclosed devices and methods are directed to at least partially alleviate one or more problems set forth above and to solve other problems in the art.

SUMMARY

One aspect of the present disclosure provides a method for fabricating a semiconductor device. The method includes: providing a base substrate; forming an isolation structure film on the base substrate, a top portion of the isolation structure film containing a plurality of first openings; forming a second opening at a bottom of each first opening by removing a portion of the isolation structure film to expose a surface of the base substrate, where the second opening has a size larger than a corresponding first opening along a direction in parallel with the surface of the base substrate; forming fins in the first and second openings; and forming an isolation structure by removing a portion of an isolation material film, where a top surface of the isolation structure is lower than a top surface of the fins and the isolation structure covers a portion of the sidewalls of the fins.

Another aspect of the present disclosure includes a semiconductor device. The semiconductor device includes: a substrate base; fins on the base substrate, where each fin has a bottom size, along a direction in parallel with a surface of the base substrate, larger than a top size of the each fin; and an isolation structure on the base substrate, where the isolation structure has a top surface lower than the fins and the isolation structure covers a portion of the sidewalls of the fins.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Semiconductor device and fabrication method are provided. The method includes: providing a base substrate; forming an isolation structure film on the base substrate, which have first openings at a top of the isolation structure film; forming second openings at a bottom of the first openings by removing a portion of the isolation structure film at the bottoms of the first openings to expose a surface of the base substrate, where a size of the second openings along a direction in parallel with the surface of the base substrate is larger than a size of the first openings; forming fins in the first and second openings; and forming an isolation structure by removing a portion of an isolation material film, where a top surface of the isolation structure is lower than a top surface of the fins and the isolation structure also cover a portion of the sidewalls of the fins. The semiconductor devices formed by the method may reduce the self-heating effect and improve the performance of semiconductor devices.

Figure 1:
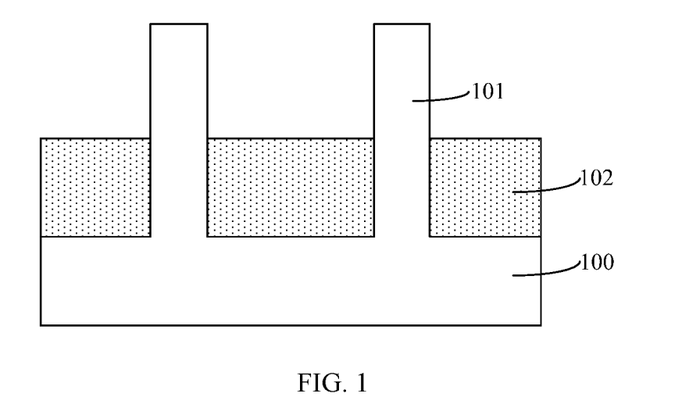
FIG. 1 illustrates a semiconductor structure corresponding to a fin field effect transistor.

FIG. 1 illustrates a semiconductor structure corresponding to a fin field effect transistor.

Referring to FIG. 1, a base substrate 100 having fins 101 may be provided; and an isolation layer 102 may be formed on the base substrate 100, where a top surface of the isolation layer 102 may be lower than a top surface of the fins 101 and the isolation layer 102 may cover a portion of sidewalls of the fins 101.

The fin field effect transistors generate heat during normal operations, that is, a self-heating effect is generated in the fin field effect transistors. The heat generated by the self-heating effect may be transferred from the fins 101 to the isolation layer 102 and the base substrate 100, and then released to the external environment via the isolation layer 102 and the base substrate 100. The material of the isolation layer 102 may include silicon dioxide which have a poor thermal conductivity, and the material of the fins 101 may include silicon which have a good thermal conductivity. In such way, the heat generated by the self-heating effect may be transferred mostly from the fins 101 to the base substrate 100, and then released to the external environment via the base substrate 100.

However, with continuous improvement in the integration of the fin field effect transistors, a size of the fins 101 along a direction perpendicular to the extending direction of the fins 101 continuously decreases, which may cause a weak ability for the fins 101 to transfer the heat generated from the self-heating effect and may accumulate more heat in the fin field effect transistors. Ultimately, the driving current of the fin field effect transistors may be reduced, and the leakage current may be serious, which may affect the lifetime of semiconductor devices.

The present disclosure provides a fabricating method for a semiconductor device. The method includes: forming a first opening by removing a portion of an isolation structure film; forming a second opening at the bottom of the first opening by removing a portion of the isolation structure film at the bottom of the first opening, where a size of the second opening may be larger than a size of the first opening along a direction in parallel with a surface of the base substrate; forming fins in the first openings and the second openings. The semiconductor devices formed by the method may reduce the self-heating effect and improve the performance of the semiconductor devices.

FIGS. 2-10 illustrate semiconductor structures corresponding to certain stages for forming an exemplary semiconductor device according to various disclosed embodiments of the present disclosure.

Figure 2:
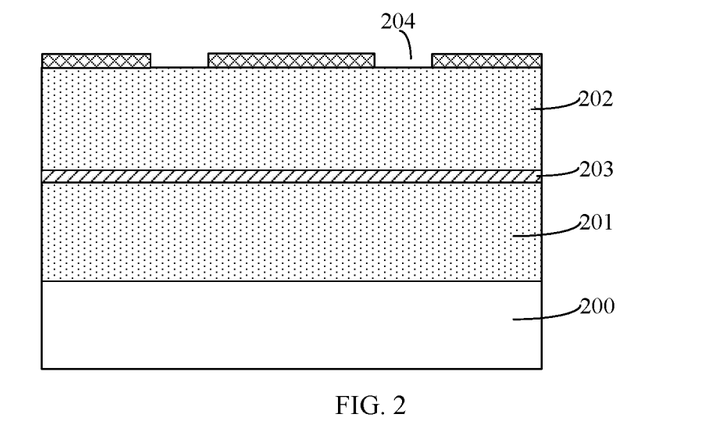
FIGS. 2-10 illustrate semiconductor structures corresponding to certain stages for forming an exemplary semiconductor device according to various disclosed embodiments of the present disclosure.

Referring to FIG. 2, a base substrate 200 may be provided; and an initial isolation structure film (not shown) may be formed on the base substrate 200.

In one embodiment, the base substrate 200 may be made of silicon. In other embodiments, the base substrate may be made of a material including germanium, silicon germanium, silicon on insulator, germanium on insulator, and/or any other suitable material(s).

The initial isolation structure film may be used for forming a subsequently formed isolation structure film.

In one embodiment, the initial isolation structure film may be a multiple-layer structure including a second isolation material film 201 on the base substrate 200, a stop layer 203 on the second isolation material film 201, and a first initial isolation material film 202 on the stop layer 203.

In other embodiments, the initial isolation structure film may be a single-layer structure and the initial isolation structure film may be made of a material including silicon dioxide or silicon oxynitride; or the initial isolation structure film may be a multiple-layer structure and may include a second isolation material film on the base substrate and a first initial isolation material film on the second isolation material film, where a stop layer may not be located between the second isolation material film and the first initial isolation material film.

In one embodiment, the second isolation material film 201 may be made of materials including silicon dioxide. The forming process of the second isolation material film 201 may include a flowable chemical vapor deposition (FCVD) or a plasma-enhanced chemical vapor deposition.

In one embodiment, the first initial isolation material film 202 may be made of a material including silicon dioxide. The forming process of the first initial isolation material film 202 may include the flowable chemical vapor deposition (FCVD) or the plasma-enhanced chemical vapor deposition.

The first initial isolation material film 202 formed by the flowable chemical vapor deposition process may have a uniform thickness, which may have a small height difference of first openings. The first openings may subsequently pass through the first initial isolation material film 202 and may be used to contain the fins subsequently. The height difference of the fins in the first openings may be small, which may improve the performance of semiconductor devices.

The thickness of the first initial isolation material film 202 may be about 800 Angstroms to about 2000 Angstroms. The thickness of the first initial isolation material film 202 may determine the depth of the first openings.

In one embodiment, the stop layer 203 may be made of silicon nitride. In other embodiments, the stop layer may be made of a material including amorphous silicon.

In one embodiment, the material of the stop layer 203 may be different from the material of the first initial isolation material film 202, so the stop layer 203 and the first initial isolation material film 202 may have different etch selectivity. After the subsequent removal of a portion of the first initial isolation material film 202, the process may stop on the top surface of the stop layer 203, which may cause a small height difference of the formed first openings. The first openings may be used to contain the fins subsequently. Ultimately, the height difference of the fins in the first openings may be small, which may improve the performance of semiconductor devices.

The forming process of the stop layer 203 may include a chemical vapor deposition process or a physical vapor deposition.

The top surface of the first initial isolation material film 202 may have a mask layer (not shown) which has mask openings 204.

The mask openings 204 may define locations and sizes of the first openings which are formed subsequently.

The size of the mask openings 204 along a width direction of the subsequent fins may be about 6 nm to about 20 nm. A size of the mask openings along the width direction of the subsequent fins may determine the size of the first openings which are formed subsequently.

Figure 3:
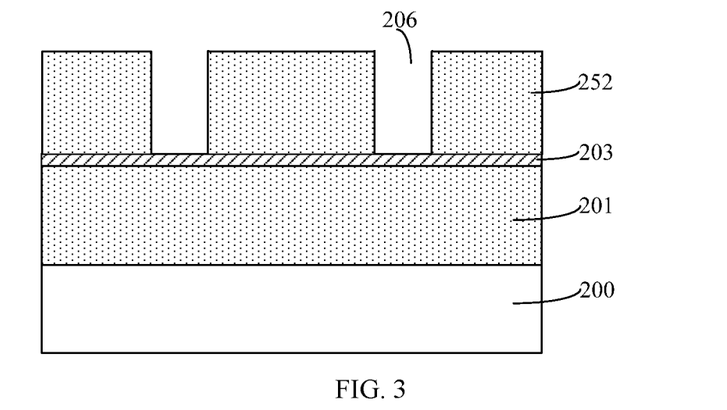

Referring to FIG. 3, using the mask layer as a mask, a first isolation material film 252, which may have first openings 206 passing through the first isolation material film 252, may be formed by etching the first initial isolation material film 202 (referring to FIG. 2) until the stop layer 203 is exposed. The mask layer may be removed after forming the first isolation material film and the first openings 206.

The isolation structure film may include: the second isolation material film 201 on the base substrate 200; and the first isolation material film 252 on the second isolation material film 201, which may have the first openings 206 passing through the first isolation material film 252.

The isolation structure film may be used for the subsequent formation of an isolation structure.

Using the mask layer as a mask, the process of etching the first isolation material film 202 may include a dry etching process, a wet etching process, or a combination thereof.

The material of the stop layer 203 may be different from the material of the first initial isolation material film 202, so the stop layer 203 and the first initial isolation material film 202 may have different etch selectivity. After the etching of a portion of the first initial isolation material film 202, the process may stop on the top surface of the stop layer 203, which may cause a small height difference of the formed first openings 206. The first openings 206 may be used to contain the fins subsequently. Ultimately, the height difference of the fins in the first openings may be small, which may improve the performance of semiconductor devices.

The depth of the first openings 206 may be determined by the thickness of the first initial isolation material film 202. The depth of the first openings 206 may be about 800 Angstroms to about 2000 Angstroms. The depth of the first openings 206 may determine the height of the subsequent fins in the first openings 206.

The size of the first openings 206 along the width direction of the subsequent fins, which may be about 6 nm to about 20 nm, may be determined by the size of the mask openings 204.

The process of removing the mask layer may include a dry etching process, a wet etching process, or a combination thereof.

Figure 4:
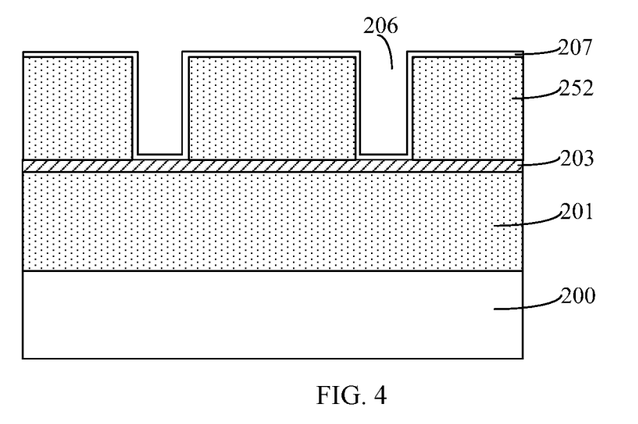

Referring to FIG. 4, a protection film 207 may be formed on a surface of the first isolation material film 252, and on sidewalls and bottoms of the first openings 206.

The protection film 207 may be made of a material including silicon nitride. The process of forming the protection film 207 may include a chemical vapor deposition process or an atomic layer deposition process.

The protection film 207 may be used to form a protection layer subsequently.

Figure 5:
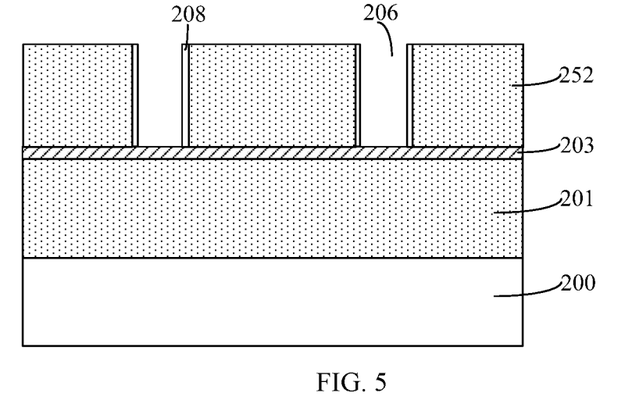

Referring to FIG. 5, the protection film 207 on the surface of the first isolation material film 252 and at the bottoms of the first openings 206 may be removed to form a protection layer 208 on the sidewalls of the first openings 206.

The process of removing the protection film 207 on the first isolation material film 252 and at the bottoms of the first openings 206 may include a dry etching process.

The protection layer 208 may be made of a material including silicon nitride. The protection layer 208 may be used to avoid the removal of the first isolation material film 252 on the sidewalls of the first openings 206 during the subsequent removal of the second isolation structure film 201 on the sidewalls of second initial openings at the bottom of the first openings 206, which may not enlarge the size of the first openings 206 along the width direction of the subsequent fins. The size of the first openings 206 along the width direction of the subsequent fins may be small, which may improve the integration of semiconductor devices.

Figure 6:
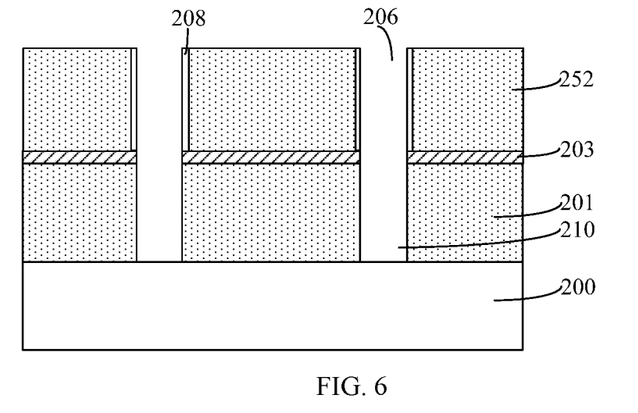

Referring to FIG. 6, after forming the protection layer 208, the stop layer 203 at the bottoms of the first openings 206 may be removed; after removing the stop layer 203 at the bottoms of the first openings 206, the second isolation material film 201 at the bottoms of the first openings 206 may be removed to expose the base substrate 200, which may form second initial openings 210 passing through the second isolation material film 201.

The process for removing the stop layer 203 at the bottoms of the first openings 206 may include a wet etching process, a dry etching process, or a combination thereof.

The removal of the stop layer 203 at the bottoms of the first openings 206 may expose the second isolation material film 201 and subsequently facilitate the formation of the second initial openings 210.

The process of removing the second isolation material film 201 at the bottoms of the first openings 206 may include a dry etching process. In the dry etching process: gases may include $CH_4$ and $CHF_3$; a flow rate of $CH_4$ may be about 8 sccm to about 500 sccm; a flow rate of $CHF_3$ may be about 30 sccm to about 200 sccm; a power of radio frequency may be about 100 W to about 1300 W; a DC voltage may be about 80 V to about 500 V; a time duration may be about 4 s to about 500 s; and a pressure may be about 10 mtorr to about 2000 mtorr.

The bottoms of the second initial openings 210 may expose the surface of the base substrate 200, which may facilitate the formation of a fin material layer using an epitaxial growth process.

Figure 7:
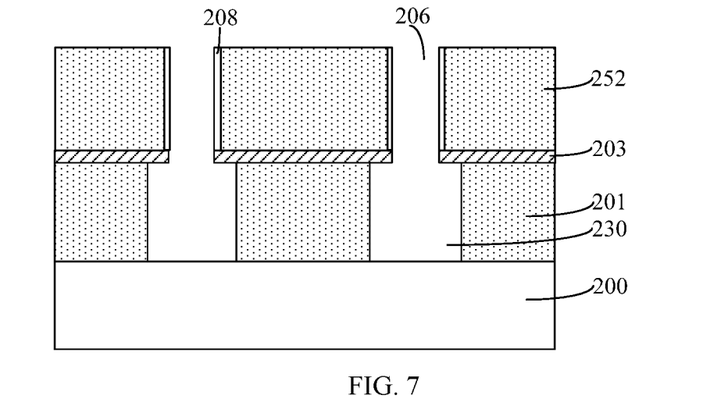

Referring to FIG. 7, a second opening 230 may be formed at the bottom of the first opening 206 by removing a portion of the second isolation material film 201 at the sidewalls of the second initial opening 210. The size of the second opening 230 along a direction in parallel with a surface of the base substrate 200 may be larger than the size of the first opening 206.

The process of removing the second isolation material film 201 on a portion of the sidewalls of the second initial openings 210 may include a wet etching process.

The size of the second openings 230 along the width direction of the subsequent fins may be about 10 nm to about 30 nm.

In the process of removing the second isolation material film 201 on the sidewalls of the second initial openings 210, the sidewalls of the first openings 206 may be covered by the protection layer 208, which may avoid the removal of the first isolation material film 202 on the sidewalls of the first openings 206 and may not enlarge the first openings 206 along a direction in parallel with a surface of the base substrate 200, and improve the integration of semiconductor devices.

The semiconductor devices may generate heat during normal operations. The second opening 230 may be at the bottom of the first opening 206 and the size of the second opening 230 along a direction in parallel with a surface of the base substrate 200 may be larger than the size of the first opening 206, which may make a large contact area of the second opening 230 with the base substrate 200. Ultimately, the fins in the subsequent second openings 230 may have a strong ability to transfer heat, the self-heating effect of semiconductor devices may be reduced, and the heat accumulation in semiconductor devices may also be reduced, which may improve the lifetime of semiconductor devices.

The bottoms of the second openings 230 may expose the surface of the base substrate 200, which may facilitate the subsequent epitaxial growth of the fin material layer and may also facilitate the heat transfer to the base substrate 200 during normal operations and reduce the self-heating effect.

Figure 8:
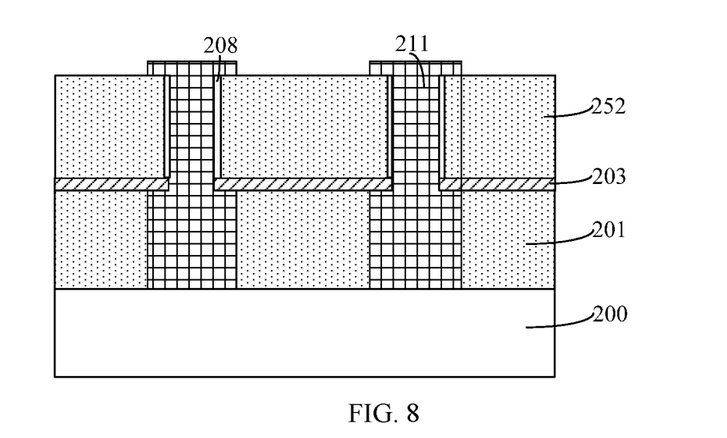

Referring to FIG. 8, a fin material layer 211 may be formed in the first opening 206, in the second opening 210 and on the first isolation material film 252.

In one embodiment, the fin material layer 211 may be made of silicon germanium. In other embodiments, the fin material layer 211 may be made of a material including silicon.

The process of forming the fin material layer 211 may include an epitaxial growth process.

The fin material layer 211 may be used to form fins subsequently.

Figure 9:
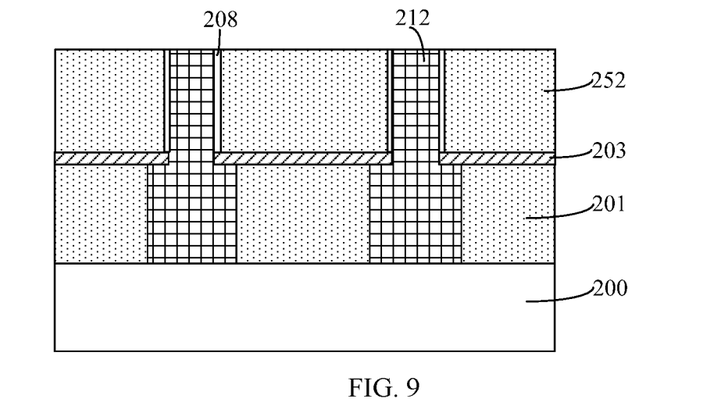

Referring to FIG. 9, the fin material layer 211 may be planarized until the top surface of the first isolation material film 252 is exposed. Each fin may be formed in each first opening 206 (referring to FIG. 7) and the corresponding second opening 230 (referring to FIG. 7).

The process of planarizing the fin material layer 211 may include a chemical mechanical polishing process.

The size of the second openings 230 along a direction in parallel with a surface of the base substrate 200 may be larger than the size of the first openings 206, which may make a large contact area of the fins 212 in the second openings 230 with the base substrate 200. Ultimately, the fins 212 in the second openings 230 may have a strong ability to transfer heat, the self-heating effect of semiconductor devices may be reduced, the heat accumulation in semiconductor devices may also be reduced, which may improve the lifetime of semiconductor devices.

Figure 10:
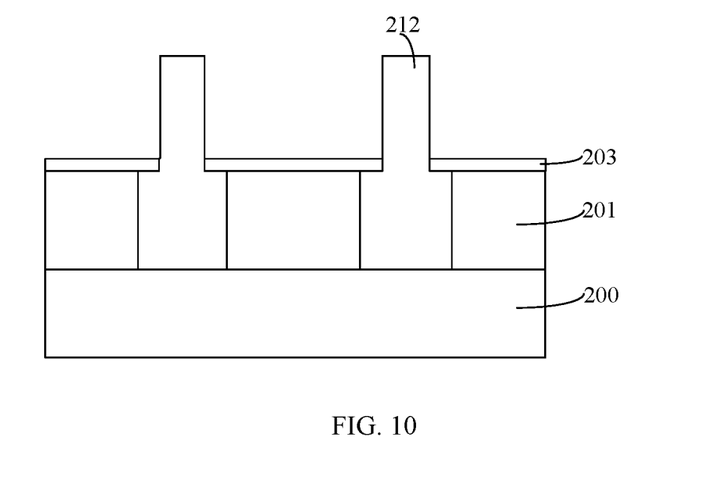
Figure 11:
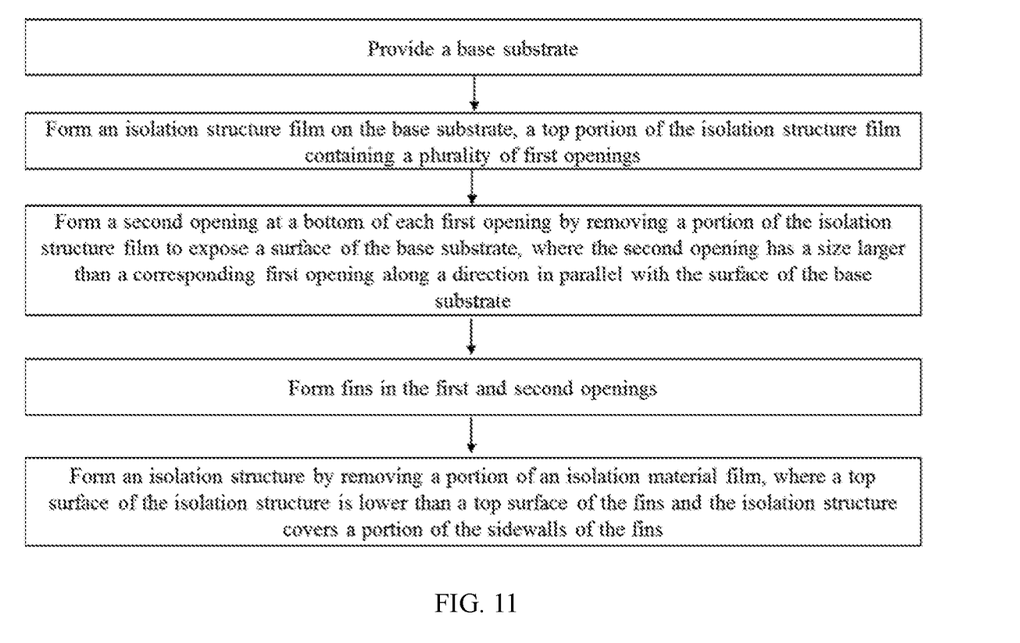
FIG. 11 illustrates an exemplary fabrication method for forming a semiconductor structure according to various disclosed embodiments of the present disclosure.

Referring to FIG. 10, the first isolation material film 252 (referring to FIG. 9) may be removed to expose the sidewalls of the fins 212 in the first openings 206; and after removing the first isolation material film 252, the protection layer 208 (referring to FIG. 9) may be removed.

At the process of removing the first isolation material film 252, the material of the first isolation material film 252 may be different from the material of the stop layer 203. After the removal of the first isolation material film 252, the process may stop on the top surface of the stop layer 203, which may cause a small height difference of the exposed fins 212 and improve the performance of semiconductor devices.

The process of removing the first isolation material film 252 may include a dry etching process, a wet etching process, or a combination thereof.

The process of removing the protection layer 208 may include a dry etching process, a wet etching process, or a combination thereof.

The second isolation material film 201 and the stop layer 203 may be used as the isolation structure, which may electrically isolate different semiconductor devices.

After the formation of the isolation structure, the method may further include: forming gate structures across the fins 212; and forming source/drain doped regions in the fins 212 on sides of each gate structure.

This disclosure embodiment may also provide a semiconductor device using the above method, as illustrated in FIG. 10, including: a substrate base 200; fins 212 on the base substrate 200, where a bottom size of each fin 212, along a direction in parallel with a surface of the base substrate 200, may be larger than a top size of each fin 212; an isolation structure on the base substrate 200, where the isolation structure may have a top surface lower than the fins 212 and also the isolation structure may cover a portion of the sidewalls of the fins 212.

The bottom size of each fin 212 along a width direction of the fins 212 may be about 10 nm to about 30 nm.

The top size of each fin 212 along a width direction of the fins 212 may be about 6 nm to about 20 nm.

The isolation structure may include the second isolation material film 201 and the stop layer 203 on the second isolation material film 201; the stop layer 203 may be made of a material including silicon nitride; and the second isolation material film 201 may be made of a material including silicon dioxide.

A distance from the top surface of the fins 212 to the stop layer 203 may be about 800 Angstroms to about 2000 Angstroms.

The semiconductor structure may further include: gate structures across the fins 212; and source/drain doped regions in the fins 212 on sides of each gate structure.

In a certain embodiment, FinFET device may be formed by the following process. For example, the silicon base substrate 200 (referring to FIG. 2) and the oxide/silicon nitride/oxide/silicon nitride multi-film structure may be used. Next, the first initial isolation material film 202 (referring to FIG. 2) may be etched and the silicon nitride protection film 207 (referring to FIG. 4) may be formed. After etching a portion of the second isolation material film 201 (referring to FIGS. 6-7), the fins 212 (referring to FIG. 9) may be formed by the epitaxial growth of silicon germanium and the subsequent chemical mechanical planarization. The removal of the first isolation material film 252 (referring to FIG. 10) may be followed. The bottom width of the fins may be larger than the top width of the fins, which may reduce the self-heating effect. The silicon nitride stop layer 203 (referring to FIG. 10) may be used for the fin height control.

In the present disclosure, the first and second openings may be used to contain the subsequently formed fins. Since the second openings are at the bottoms of the first openings, the heat generated from semiconductor devices during normal operations may be released to the external environment via the fins in the second openings. The size of the second openings along a direction in parallel with a surface of the base substrate may be larger than the size of the first openings, which may make a large contact area of the second openings with the base substrate. Ultimately, the fins of the subsequent second openings may have a strong ability to transfer heat and the heat accumulation in semiconductor devices may be reduced. In such way, the self-heating effect of semiconductor devices may be reduced, which may improve the lifetime of semiconductor devices.

In the present disclosure, the stop layer may be located between the first initial isolation material film and the second isolation material film. The stop layer may be used as a stop layer to form the first openings, which may cause a small height difference of the formed plurality of first openings. The first openings may be used to contain the fins subsequently. Ultimately, the height difference of the fins in the first openings may be small, which may improve the performance of semiconductor devices.

In the present disclosure, the protection layer may be form on the sidewalls of the first openings after the formation of the first openings and before the formation of the second initial openings. The protection layer may be used to avoid the removal of the isolation structure film on the sidewalls of the first openings during the subsequent formation of the second openings and avoid a large size of the first openings along a direction perpendicular to a sidewall direction of the first openings. The first openings may be used to contain the subsequent fins, which may avoid a large size of the first openings in the fins along a direction perpendicular to a sidewall direction of fins and improve the integration of semiconductor devices.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor device, comprising:
   providing a base substrate;
   forming an isolation structure film on the base substrate, a top portion of the isolation structure film containing a plurality of first openings therethrough;
   forming a second opening at a bottom of each first opening by removing a portion of the isolation structure film to expose a surface of the base substrate, wherein, along a direction in parallel with the surface of the base substrate, the second opening has a size larger than a corresponding first opening;
   forming fins in the first and second openings; and
   forming an isolation structure by removing a portion of an isolation material film, wherein a top surface of the isolation structure is lower than a top surface of the fins and the isolation structure covers a portion of the sidewalls of the fins.

2. The fabrication method according to claim 1, wherein:
a size of the first opening along a width direction of the fins is about 6 nm to about 20 nm.

3. The fabrication method according to claim 1, wherein:
a size of the second opening along a width direction of the fins is about 10 nm to about 30 nm.

4. The fabrication method according to claim 1, wherein:
the isolation structure film includes a first isolation material film containing the plurality of first openings therethrough, and a second isolation material film under the first isolation material film and on the base substrate, and wherein forming the isolation structure film includes:
forming an initial isolation structure film on the base substrate, wherein the initial isolation structure film includes the second isolation material film on the base substrate and a first initial isolation material film on the second isolation material film; and
removing a portion of the first initial isolation material film to expose the second isolation material film to form the plurality of first openings passing through the first isolation material film.

5. The fabrication method according to claim 4, wherein forming the second openings includes:
removing the second isolation material film at the bottom of each first opening to expose the surface of the base substrate to form a second initial opening, which passes through the second isolation material film; and
further removing a portion of the second isolation material film on the sidewalls of the second initial opening to form the second opening.

6. The fabrication method according to claim 5, further including:
forming a stop layer between the first initial isolation material film and the second isolation material film, wherein the bottoms of the plurality of first openings expose the stop layer; and
before forming the second initial openings, removing a portion of the stop layer at the bottom of the each first opening.

7. The fabrication method according to claim 4, wherein:
a thickness of the first initial isolation material film is about 800 Angstroms to about 2000 Angstroms.

8. The fabrication method according to claim 5, wherein forming the second initial openings includes a dry etching process, including:
a gas including $CH_4$, $CHF_3$ or a combination thereof;
a flow rate of $CH_4$ of about 8 sccm to about 500 sccm;
a flow rate of $CHF_3$ of about 30 sccm to about 200 sccm;
a power of radio frequency of about 100 W to about 1300 W;
a direct current voltage of about 80 V to about 500 V;
a time duration of about 4 s to about 500 s; and
a pressure of about 10 mtorr to about 2000 mtorr.

9. The fabrication method according to claim 1, after forming the first openings and before forming the second openings, further including:
forming a protection layer on sidewalls of the plurality of the first openings by:
forming a protection film on the isolation structure film and on the sidewalls and bottoms of the plurality of first openings, and
removing the protection film from the isolation structure film and the bottoms of the plurality of first openings.

10. The fabrication method according to claim 9, wherein:
the protection layer is made of a material including silicon nitride; and the isolation structure film is made of a material including silicon dioxide.

11. The fabrication method according to claim 1, wherein forming the fins includes:
forming a fin material layer on the top of the isolation structure film, and in the first and second openings; and
planarizing the fin material layer until the isolation structure film is exposed, wherein each fin is formed in the each first and a corresponding second opening.

12. The fabrication method according to claim 1, after forming the isolation structure, further including:
forming gate structures across fins; and
forming source/drain doped regions in the fins on sides of each gate structure.

* * * * *